(12) United States Patent
Tanaka

(10) Patent No.: US 10,026,833 B2
(45) Date of Patent: Jul. 17, 2018

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Hiroyuki Tanaka, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/390,551

(22) Filed: Dec. 26, 2016

(65) Prior Publication Data

US 2017/0229448 A1 Aug. 10, 2017

(30) Foreign Application Priority Data

Feb. 9, 2016 (JP) .................. 2016-022660

(51) Int. Cl.
- *H01L 21/3205* (2006.01)
- *H01L 27/088* (2006.01)
- *H01L 29/739* (2006.01)
- *H01L 29/66* (2006.01)
- *H01L 29/40* (2006.01)
- *H01L 27/06* (2006.01)
- *H01L 29/06* (2006.01)

(52) U.S. Cl.
CPC ...... *H01L 29/7397* (2013.01); *H01L 27/0629* (2013.01); *H01L 29/0619* (2013.01); *H01L 29/0649* (2013.01); *H01L 29/402* (2013.01); *H01L 29/66348* (2013.01)

(58) Field of Classification Search
CPC .................................................. H01L 29/7397

USPC .................. 257/332, 396; 438/259, 270, 589
See application file for complete search history.

(56) References Cited

U.S. PATENT DOCUMENTS

| | | | |
|---|---|---|---|
| 7,109,551 B2 * | 9/2006 | Sugi .................. | H01L 21/76283 257/162 |
| 7,989,249 B2 * | 8/2011 | Bluzer .................. | B81B 3/0081 257/414 |
| 8,217,425 B2 * | 7/2012 | Miyoshi .............. | H01L 27/0664 257/202 |
| 8,502,344 B2 * | 8/2013 | Lu ........................ | H01L 29/0696 257/557 |
| 8,546,905 B2 * | 10/2013 | Kato ............... | H01L 21/823857 257/471 |

(Continued)

FOREIGN PATENT DOCUMENTS

| JP | 2002-270841 A | 9/2002 |
|---|---|---|
| JP | 2003-264289 A | 9/2003 |
| JP | 2010-287786 A | 12/2010 |

*Primary Examiner* — Calvin Lee

(57) ABSTRACT

To provide a semiconductor device with a high degree of flatness, provided is a semiconductor device including a semiconductor substrate; an element insulating film that is formed on a front surface side of the semiconductor substrate and includes a groove; and a semiconductor element provided in the groove of the element insulating film. The semiconductor device further comprises a withstand voltage structure farther to the outside than the active region, the withstand voltage structure includes a field insulating film formed on the front surface of the semiconductor substrate, and film thickness of a region of the element insulating film where the groove is not provided is the same as film thickness of the field insulating film.

17 Claims, 9 Drawing Sheets

(56) References Cited

U.S. PATENT DOCUMENTS

2012/0235142 A1\* 9/2012 Song ................... H01L 25/167
                  257/48

\* cited by examiner

SEMICONDUCTOR DEVICE AND SEMICONDUCTOR DEVICE MANUFACTURING METHOD

The contents of the following Japanese patent application are incorporated herein by reference:
NO. 2016-022660 filed in JP on Feb. 9, 2016.

BACKGROUND

1. Technical Field

The present invention relates to a semiconductor device and a semiconductor device manufacturing method.

2. Related Art

Conventionally, a configuration is known in which an insulating film is provided on a semiconductor substrate on which a semiconductor element such as an IGBT is formed, and a semiconductor element such as a diode for detecting temperature is provided on this insulating film, as shown in Patent Document 1, for example.
Patent Document 1: Japanese Application Publication No. 2002-270841

However, when a further semiconductor element is formed above the insulating film provided on the semiconductor substrate, the height difference on the semiconductor substrate is made larger. When the height difference on the semiconductor substrate is made larger, it becomes difficult to form fine structures near the portions having this height difference.

SUMMARY

According to a first aspect of the present invention, provided is a semiconductor device comprising a semiconductor substrate, an element insulating film, and a semiconductor element. The element insulating film may be formed on a front surface side of the semiconductor substrate and may include a groove. The semiconductor element may be provided in the groove of the element insulating film.

The semiconductor substrate may include an active region, and the semiconductor device may further comprise a withstand voltage structure farther to the outside than the active region. The semiconductor element may be provided in the active region. The withstand voltage structure may include a field insulating film formed on the front surface of the semiconductor substrate. Film thickness of a region of the element insulating film where the groove is not provided is the same as film thickness of the field insulating film.

The semiconductor substrate may include one or more recessed portions in the front surface. At least a portion of the element insulating film may be provided in the one or more recessed portions. The entire element insulating film may be provided in the one or more recessed portions. A front surface of the semiconductor element may be provided at the same position as or at a lower position than the front surface of the semiconductor substrate.

At least a portion of the field insulating film may be provided in a recessed portion that is different from the one or more recessed portions in which the element insulating film is provided. The entire field insulating film may be provided in the recessed portion.

The semiconductor device may further comprise a gate electrode and a gate insulating film formed on the front surface side of the semiconductor substrate. Film thickness of the element insulating film in a region where the groove is not provided may be greater than film thickness of the gate insulating film.

The film thickness of the element insulating film in a region where the groove is provided may be greater than the film thickness of the gate insulating film. The film thickness of the element insulating film in the region where the groove is provided may be greater than or equal to 300 nm. Width of the element insulating film in the region where the groove is not provided may be greater than the film thickness of the gate insulating film.

A gate trench may be formed in the front surface side of the semiconductor substrate. The gate electrode and the gate insulating film may be formed inside the gate trench. Width of the groove of the element insulating film may be greater than width of the gate trench.

According to a second aspect of the present invention, provided is a semiconductor device manufacturing method comprising forming an element insulating film, forming a groove, and forming a semiconductor element. The forming an element insulating film may include forming an element insulating film on a front surface side of a semiconductor substrate. The forming a groove may include forming a groove in the element insulating film. The forming a semiconductor element may include forming a semiconductor element in the groove of the element insulating film.

The forming the element insulating film may include forming a field insulating film farther to the outside of the semiconductor substrate than the semiconductor element at the same time as the element insulating film. The semiconductor device manufacturing method may further comprise, between the forming the element insulating film and the forming the groove, forming a masking insulating film on the front surface of the semiconductor substrate. The forming the groove may include forming an opening in the masking insulating film at the same time as forming the groove.

The semiconductor device manufacturing method may further comprise, before the forming the element insulating film, forming one or more recessed portions in the front surface of the semiconductor substrate. The forming the element insulating film may include forming at least a portion of the element insulating film in the one or more recessed portions. The forming the one or more recessed portions may include forming the one or more recessed portions using isotropic etching.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
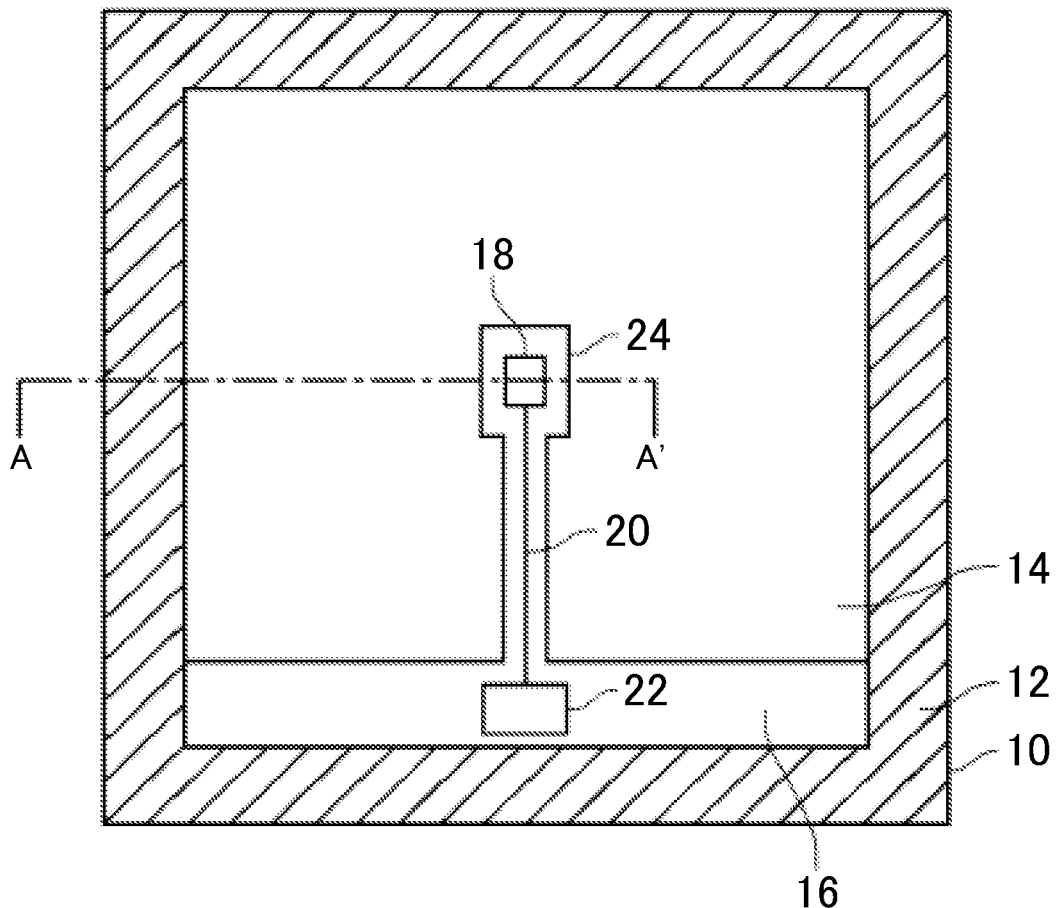
FIG. 1 shows a schematic overhead view of a semiconductor device 100 according to one embodiment of the present invention.

FIG. 1 shows a schematic overhead view of a semiconductor device 100 according to one embodiment of the present invention. FIG. 1 shows a front surface of the semiconductor device 100 on which a diode 18 is provided. The semiconductor device 100 includes a semiconductor substrate 10 made of silicon or the like. The semiconductor substrate 10 includes an active region 14 and a withstand voltage structure 12. A power semiconductor element such as an IGBT (Insulated Gate Bipolar Transistor) is formed in the active region 14.

The diode 18 for detecting temperature is provided in the active region 14. The diode 18 is an example of a semiconductor element. The diode 18 in this example is arranged near the center of the active region 14. The diode 18 is provided on the element insulating film 24. The element insulating film 24 is formed on the front surface side of the semiconductor substrate 10. The element insulating film 24 may be formed in contact with the front surface of the semiconductor substrate 10, a portion of the element insulating film 24 may be buried in the semiconductor substrate 10, or another layer may be interposed between the element insulating film 24 and the front surface of the semiconductor substrate 10.

The withstand voltage structure 12 is provided in a manner to surround the active region 14. The withstand voltage structure 12 is provided closer to the outside of the semiconductor substrate 10 than the diode 18 and the active region 14. The withstand voltage structure 12 in this example is provided along the edge of the semiconductor substrate 10. The withstand voltage structure 12 includes a guard ring, a field plate, or the like, restricts the focusing of the electrical field at the termination end of the active region 14, and improves the withstand voltage of the semiconductor device 100.

A pad region 16 is provided on the front surface of the semiconductor substrate 10. A pad 22 connecting to the diode 18, a pad connecting to another semiconductor element provided in the active region 14, and the like are formed in the pad region 16. There are also cases where semiconductor elements such as transistors and diodes are formed along with corresponding pads in the pad region 16. A wire 20 for connecting the diode 18 and the pad 22 is formed above the front surface of the semiconductor substrate 10. The pad 22 and the wire 20 are provided for each cathode and anode of the diode 18, but FIG. 1 schematically shows just one set of a pad 22 and a wire 20. An insulating film is provided between the wire 20 and pad 22 and the front surface of the semiconductor substrate 10. At least a portion of this insulating film may be the element insulating film 24.

Figure 2:
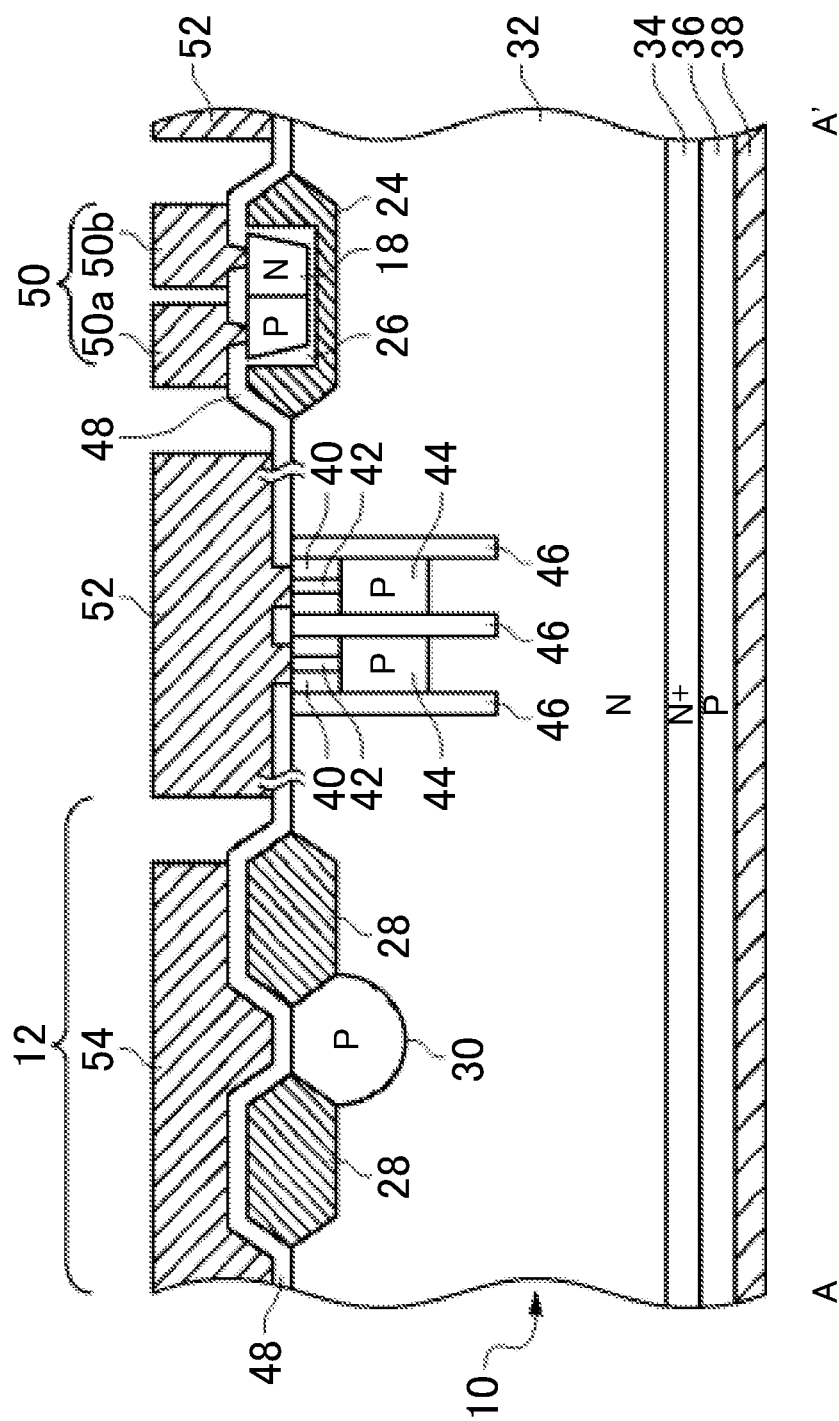
FIG. 2 shows the A-A' cross section from FIG. 1.

FIG. 2 shows the A-A' cross section from FIG. 1. However, in FIG. 2, a portion of the withstand voltage structure 12 is omitted. The element insulating film 24 in the present example is a LOCOS (Local Oxidation of Silicon) film formed by locally oxidizing the front surface of the semiconductor substrate 10.

The semiconductor substrate 10 in the present example is an N-type (or (N−)-type) substrate. At least a portion of the power semiconductor element, such as an IGBT, is formed on the front surface side of the semiconductor substrate 10. A partial region of the semiconductor substrate 10 functions as a drift region 32 in which carriers move between the front surface and a back surface. On the back surface side of the semiconductor substrate 10, an (N+)-type field stop layer 34, a P-type collector layer 36, and a collector electrode 38 are formed below the drift region 32.

A groove 26 is formed in the front surface of the element insulating film 24. The groove 26 is a depressed portion provided in a manner to not penetrate through the element insulating film 24. The diode 18 is formed in the groove 26. The entire diode 18 may be formed inside the groove 26, or a portion of the diode 18 may be formed inside the groove 26. The diode 18 may be covered by the element insulating film 24, aside from the front surface thereof.

With such a configuration, compared to a configuration in which a semiconductor element such as a diode is mounted on an element insulating film that does not include a groove, it is possible to reduce the height by which the semiconductor element such as the diode protrudes from the front surface of the semiconductor substrate 10. Therefore, it is possible to improve the flatness of the front surface of the semiconductor substrate 10, and to ensure surface area where fine structures can be formed. Furthermore, it is possible to reduce the distance between the active region 14 of the power semiconductor element such as the IGBT and the semiconductor element such as the diode 18, thereby achieving miniaturization of the semiconductor device.

The front surface of the diode 18 is covered by an interlayer insulating film 48. A contact hole for connecting the diode electrode 50 and the diode 18 is provided in the interlayer insulating film 48. The diode electrode 50 is connected to the pad 22 via the wire 20. A diode electrode 50 is provided for each of the cathode and the anode.

Field insulating films 28 are formed locally in the withstand voltage structure 12. The field insulating films 28 are LOCOS films, for example. A P-type guard ring 30 may be formed between two adjacent field insulating films 28. The interlayer insulating film 48 is formed on the field insulating films 28 and the guard ring 30. An electrode 54 is formed on the interlayer insulating film 48. The electrode 54 may be electrically connected to the guard ring 30. A field plate may be provided on the field insulating film 28.

The semiconductor element such as the IGBT is formed between the diode 18 and the withstand voltage structure 12. In the present example, an IGBT including a plurality of gate trenches 46 is formed. In the mesa portion between adjacent gate trenches 46, an (N+)-type emitter region 40, a P-type base region 44, and an N-type drift region 32 are formed in the stated order from the front surface side of the semiconductor substrate 10. As an example, the width of each gate trench 46 is less than or equal to 1.5 μm, and the distance between adjacent gate trenches 46 is less than or equal to 5 μm.

A (P+)-type contact region 42 is formed in a portion of the emitter region 40. The contact region 42 is formed from the front surface of the semiconductor substrate 10 to the base region 44. An emitter electrode 52 is provided above the front surface of the semiconductor substrate 10. The interlayer insulating film 48 is formed between the gate trenches 46 and the emitter electrode 52 to insulate the gate trenches 46 from the emitter electrode 52. In each mesa portion in the interlayer insulating film 48, a contact hole is formed to expose the emitter region 40 and the contact region 42. The emitter electrode 52 is electrically connected to the emitter region 40 and the contact region 42 via these contact holes.

As described above, the semiconductor device 100 in the present example can restrict the height by which the diode 18 protrudes from the front surface of the semiconductor substrate 10. Therefore, it is possible to improve the flatness of each layer that is layered near the diode 18, and the diode 18 and semiconductor element such as the IGBT can be formed with a short distance therebetween. Accordingly, it is possible to increase the surface area where the semiconductor element such as the IGBT can be formed, or to reduce the chip size.

Figure 3:
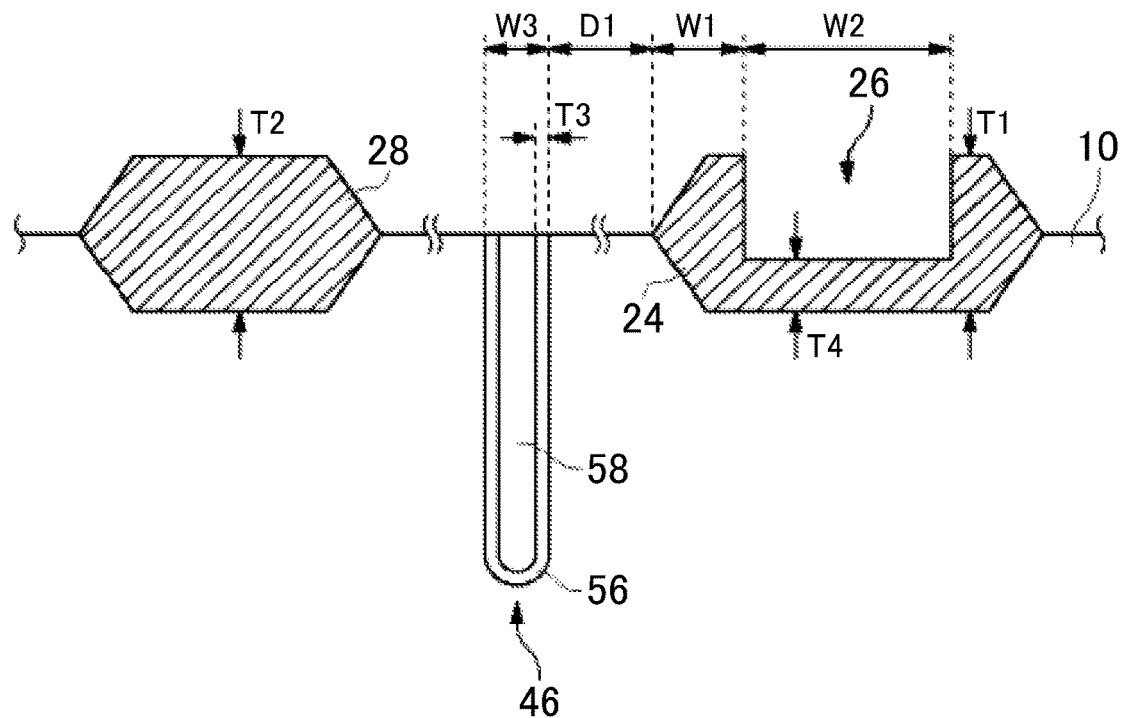
FIG. 3 is a schematic cross-sectional view of the element insulating film 24, the field insulating film 28, and a gate trench 46.

FIG. 3 is a schematic cross-sectional view of the element insulating film 24, the field insulating film 28, and gate trenches 46. In the present example, the film thickness T1 of the element insulating film 24 in the region where the groove 26 is not provided is the same as the film thickness T2 of the field insulating film 28. The film thicknesses T1 and T2 refer to thickness in a depth direction connecting the front surface and back surface of the semiconductor substrate 10. Furthermore, the film thicknesses T1 and T2 may refer to the largest value of the thickness of each insulating film in the depth direction.

With such a structure, the element insulating film 24 can be formed in the same step as the field insulating film 28. Therefore, the manufacturing cost of the semiconductor device can be reduced. In this Specification, when the film thickness or the like is referred to as having the same size, this can include both a case where the sizes of the film thickness or the like are exactly the same and a case in which there is a difference between the sizes of the film thickness or the like due to manufacturing variation or the like. For example, values with a difference therebetween of less than or equal to ±10% can be referred to as being the same.

In the region where the groove 26 of the element insulating film 24 is provided, the film thickness T4 of the remaining insulating film is enough to ensure sufficient withstand voltage between the diode 18 and the semiconductor substrate 10. The film thickness T4 is greater than the film thickness T3 of the gate insulating film 56 of the gate trench 46. The film thickness T3 of the gate insulating film 56 may be the film thickness at the portion of the gate insulating film 56 having the greatest insulating film thickness. Since the film thickness T1 of the element insulating film 24 is greater than the film thickness T4, the film thickness T1 is also greater than the film thickness T3 of the gate insulating film 56. The film thickness T4 may be greater than or equal to 10 times the film thickness T3, or may be greater than or equal to 50 times the film thickness T3. The film thickness T4 may be greater than or equal to 300 nm. The film thickness T4 may be the film thickness of the region where the groove 26 is provided that has the lowest insulating film thickness.

The gate trench 46 includes a gate insulating film 56 covering the inner trench walls and a gate electrode 58 formed in a manner to be surrounded by the gate insulating film 56. The gate insulating film 56 can be formed by oxidizing the inner trench walls. The gate electrode 58 is formed by polysilicon doped with impurities, for example. The polysilicon forming the gate electrode 58 is formed below the polysilicon forming the diode 18.

The width W1 of the region of the element insulating film 24 where the groove 26 is not provided also has enough length to be able to ensure sufficient withstand voltage between the diode 18 and the semiconductor substrate 10. The width W1 is greater than the film thickness T3 of the gate insulating film 56 of the gate trench 46. The width W1 may be greater than or equal to 10 times the film thickness T3, or may be greater than or equal to 50 times the film thickness T3. The width W1 may be greater than or equal to 300 nm. The width W1 may refer to the greatest length of the region where the groove 26 is not provided, in a direction parallel to the front surface of the semiconductor substrate 10.

The width W2 of the groove 26 is large enough to enable the semiconductor element such as the diode 18 for detecting temperature to be formed. For example, the width W2 of the groove 26 is greater than the width W3 of the gate trench 46. The width W2 may be greater than or equal to 10 times the width W3, or may be greater than or equal to 50 times the width W3.

In the semiconductor device 100, the semiconductor element such as the diode 18 is provided in the groove 26 of the element insulating film 24. Therefore, as described above, the distance D1 between the end of the element insulating film 24 and the gate trench 46 can be decreased and the surface area where the power semiconductor element such as the IGBT can be formed can be increased. The distance D1 refers to the distance between the element insulating film 24 and the gate trench 46 that is closest to the element insulating film 24 among the plurality of gate trenches 46.

Figure 4:
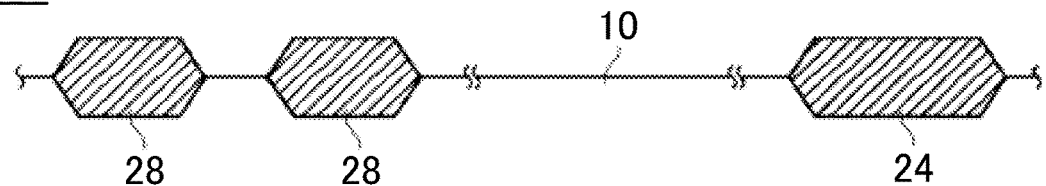
FIG. 4 is a drawing for partially describing an example of a manufacturing process of the semiconductor device 100.
Figure 4:
Figure 4:
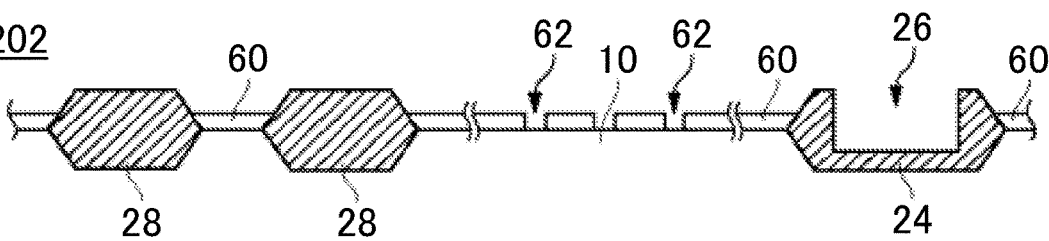
Figure 4:
Figure 4:
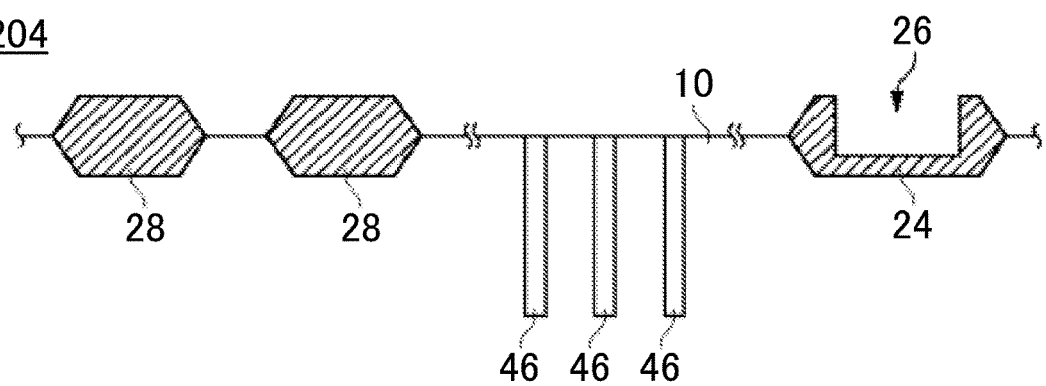
Figure 4:
Figure 4:
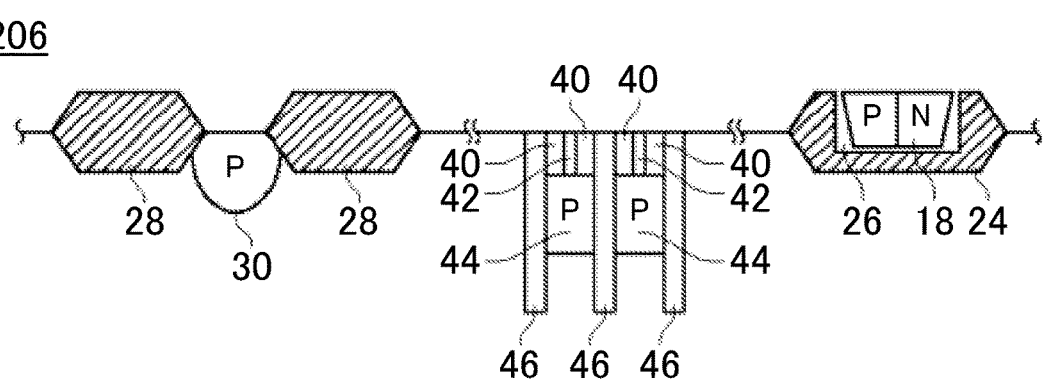

FIG. 4 is a drawing for partially describing an example of a manufacturing process of the semiconductor device 100. First, in an insulating film formation step S200, the element insulating film 24 and the field insulating film 28 are formed on the front surface of the semiconductor substrate 10.

In the present example, the element insulating film 24 and the field insulating film 28 are LOCOS films. The element insulating film 24 and the field insulating film 28 are formed simultaneously. For example, a mask member corresponding to the element insulating film 24 and the field insulating film 28 is provided on the front surface of the semiconductor substrate 10, and the front surface of the semiconductor substrate 10 is locally oxidized to simultaneously grow the element insulating film 24 and the field insulating film 28. The element insulating film 24 and the field insulating film 28 in this example have the same thickness. The element insulating film 24 and the field insulating film 28 may have different widths.

Next, at the groove formation step S202, the groove 26 is formed in the element insulating film 24. The groove 26 can be formed by etching the front surface of the element insulating film 24. This etching is preferably anisotropic etching.

A mask formation step may be further included between the insulating film formation step S200 and the groove formation step S202. In the mask formation step, a masking insulating film 60 for forming the gate trenches 46 is formed on the front surface of the semiconductor substrate 10. The masking insulating film 60 can be formed by oxidizing the front surface of the semiconductor substrate 10. The masking insulating film 60 can also be grown on the field insulating film 28 and the element insulating film 24, but the film thickness of the masking insulating film 60 in this region is less than that of the masking insulating film 60 formed in the region where the front surface of the semiconductor substrate 10 is exposed. In the example of FIG. 4, the insulating film on the field insulating film 28 and the element insulating film 24 is omitted. The masking insulating film 60 may be formed using a method such as CVD.

After the masking insulating film 60 is formed on the front surface of the semiconductor substrate 10, the region of the masking insulating film 60 corresponding to the gate trench 46 is etched to form the openings 62. In the present example, the openings 62 in the masking insulating film 60 are formed at the same time as the groove 26. For example, an etching mask corresponding to the groove 26 and the openings 62 is formed on the masking insulating film 60 and the element insulating film 24, and the masking insulating film 60 and element insulating film 24 are etched.

The depth of the groove 26 may be the same as the depth of the openings 62, or may be greater than the depth of the openings 62. The etchant used to etch the masking insulating film 60 and the element insulating film 24 preferably uses a material having a sufficiently high selectivity ratio for the insulating film and the semiconductor substrate 10. By continuing the etching even after the openings 62 have been formed, the groove 26 can be formed to be deeper than the openings 62. The bottom portion of the groove 26 may be formed farther inside the semiconductor substrate 10 than the front surface of the semiconductor substrate 10.

Next, in the trench formation step S204, the gate trenches 46 are formed at the positions of the openings 62. In step S204, first, the trenches are formed at the positions of the openings 62, and then the inner trench walls are oxidized to form the gate insulating film 56. Furthermore, the trenches are filled with a conductive material such as polysilicon to form the gate electrode 58. The masking insulating film 60 is then removed.

For the etching performed during trench formation, the etching selectivity ratio between the semiconductor substrate 10 and the element insulating film 24 is preferably greater than or equal to 30. In this way, the thickness of the element insulating film 24 below the groove 26 can be easily ensured.

Next, in the element formation step S206, the diode 18 is formed in the groove 26 of the element insulating film 24. In S206, first, the semiconductor material such as polysilicon is formed in the groove 26. The semiconductor material may be patterned to have a prescribed shape using photolithography and etching. Next, prescribed impurities are injected into this semiconductor material to form the P-type region and the N-type region.

Furthermore, prescribed impurities are injected into the mesa portion between the gate trenches 46 to form the emitter region 40, the contact region 42, and the base region 44. The injection of the impurities for forming the diode 18 and the injection of the impurities into the mesa portion may be performed simultaneously. For example, any one of the step of injecting impurities into the base region 44 and the step of injecting impurities into the contact region 42 is the same step as the step of injecting the impurities into the P-type region of the diode 18. Furthermore, the step of injecting impurities into the emitter region 40 is the same step as the step of injecting impurities into the N-type region of the diode 18. Yet further, the step of injecting impurities into the P-type region of the diode 18 may be the same step as the step of injecting impurities into the guard ring 30.

As a result of the steps above, it is possible to form the semiconductor element such as the diode 18 in the groove 26 of the element insulating film 24. Furthermore, at least a portion of the steps for forming the element insulating film 24, the groove 26, and the diode 18 can be performed in the same step, and therefore the manufacturing process can be shortened.

Figure 5:
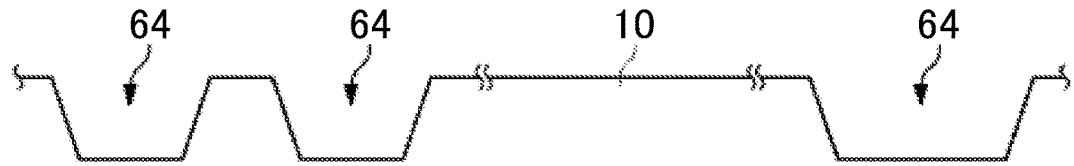
FIG. 5 is a drawing for partially describing another exemplary manufacturing process of the semiconductor device 100.
Figure 5:
Figure 5:
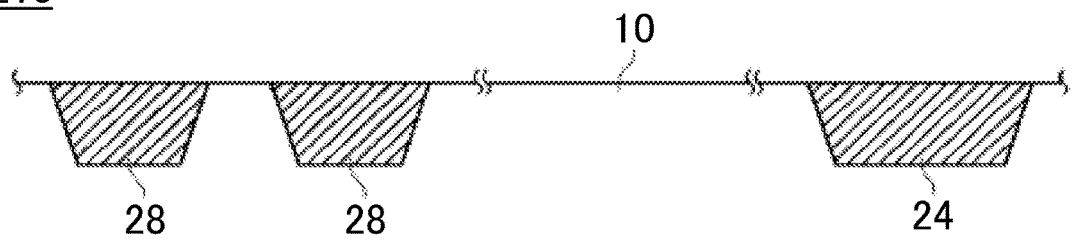
Figure 5:
Figure 5:
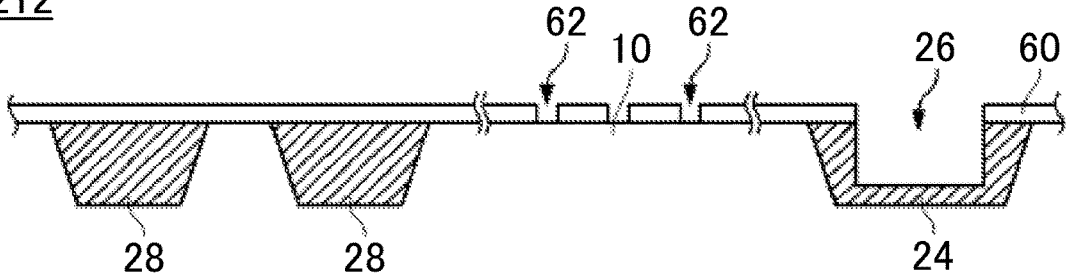
Figure 5:
Figure 5:
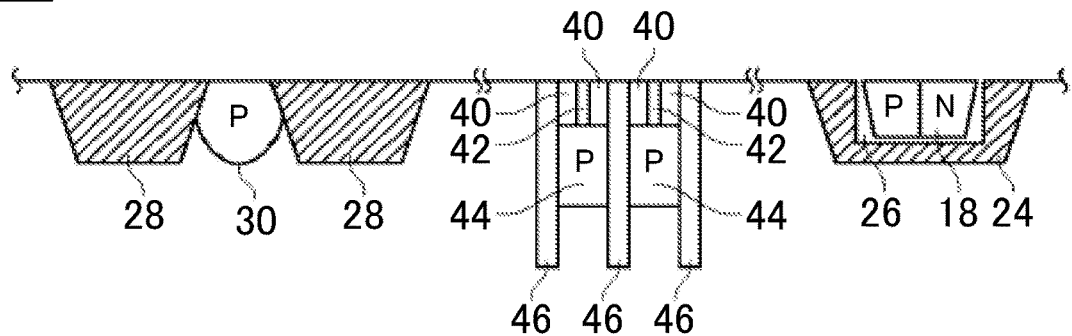

FIG. 5 is a drawing for partially describing another exemplary manufacturing process of the semiconductor device 100. In the present example, in a recess formation step S208, one or more recessed portions 64 are formed in the front surface of the semiconductor substrate 10. The recessed portions 64 are formed at positions where the element insulating film 24 and the field insulating film 28 are to be provided.

In S208, the front surface of the semiconductor substrate 10 is locally etched to form the recessed portion 64. This etching is preferably isotropic etching. If the recessed portions 64 are formed using anisotropic etching, the angle of the side walls of the recessed portions 64 becomes sever. As a result, when the insulating film is formed inside the recessed portions 64, there are cases where the insulating film piles upward near the outer edges of the recessed portions 64.

The outer edges of the recessed portions 64 are close to the power semiconductor element such as the IGBT, and therefore, when unevenness occurs at these locations, there is a significant effect on the region where the power semiconductor element is to be formed. Therefore, it becomes difficult for the power semiconductor element to be formed near the recessed portions 64. In contrast to this, by forming the recessed portions 64 using isotropic etching, it is possible to form the side walls of the recessed portions 64 with a gentle slope, and to restrict the piling up of the insulating film at the outer edges of the recessed portions 64.

Next, in an insulating film formation step S210, at least a portion of the element insulating film 24 is formed inside the recessed portions 64. The entire element insulating film 24 may be formed inside the recessed portions 64. In other words, the front surface of the element insulating film 24 may be formed at a position that is the same height as or lower than the front surface of the semiconductor substrate 10. The position lower than the front surface of the semiconductor substrate 10 refers to a position that is farther inside the semiconductor substrate 10 than the front surface of the semiconductor substrate 10. As another example, a portion of the element insulating film 24 may protrude upward beyond the front surface of the semiconductor substrate 10. The portion of the element insulating film 24 protruding upward beyond the front surface of the semiconductor substrate 10 is preferably thinner than the portion of the element insulating film 24 below the front surface.

As one example, the depth of each recessed portion 64 is less than or equal to 500 nm. The thickness of the element insulating film 24 is less than or equal to 1200 nm. The thickness of the element insulating film 24 may be the same as the depth of each recessed portion 64.

In the same manner as in the insulating film formation step S200 shown in FIG. 4, in S210 as well, the element insulating film 24 and the field insulating film 28 may be formed simultaneously. At least a portion of the field insulating film 28 may be formed inside a recessed portion 64 differing from the recessed portion 64 in which the element insulating film 24 is formed. In the present example, the entire field insulating film 28 is formed inside this recessed portion 64.

The element insulating film 24 and the field insulating film 28 may be LOCOS films, or may be films formed using CVD or the like. The element insulating film 24 and the field insulating film 28 in the present example are LOCOS films.

Next, in a groove formation step S212, the groove 26 is formed in the element insulating film 24. In the same manner as the groove formation step S202 shown in FIG. 4, the groove 26 may be formed at the same time as the openings 62 in the masking insulating film 60. The masking insulating film 60 may be formed using CVD or the like. After the openings 62 are formed in the masking insulating film 60, the gate trenches 46 are formed, in the same manner as in the trench formation step S204 shown in FIG. 4.

Next, in an element formation step S214, the diode 18 is formed in the groove 26 of the element insulating film 24. Furthermore, along with the formation of the emitter region 40, the contact region 42, and the base region 44 in the mesa portion between the gate trenches 46, the guard ring 30 is formed. In the same manner as in the element formation step S200 shown in FIG. 4, in S214 as well, the injection of impurities for forming the diode 18 and the injection of impurities into the mesa portion between the gate trenches 46 or the injection of impurities for forming the guard ring 30 may be performed simultaneously. Furthermore, the position of the front surfaces of the element insulating film 24 and the diode 18 may be made the same as the position of the front surface of the semiconductor substrate 10 using CMP or the like.

With the semiconductor device 100 manufactured according to the manufacturing process of the present example, the element insulating film 24 is formed in a recessed portion 64, and therefore it is possible to further reduce the unevenness in the front surface of the semiconductor substrate 10. The front surface of the diode 18 may be provided at the same position as or a lower position than the front surface of the semiconductor substrate 10. In other words, the entire diode 18 may be formed inside the semiconductor substrate 10. In this way, the unevenness in the front surface of the semiconductor substrate 10 can be further reduced.

Figure 6:
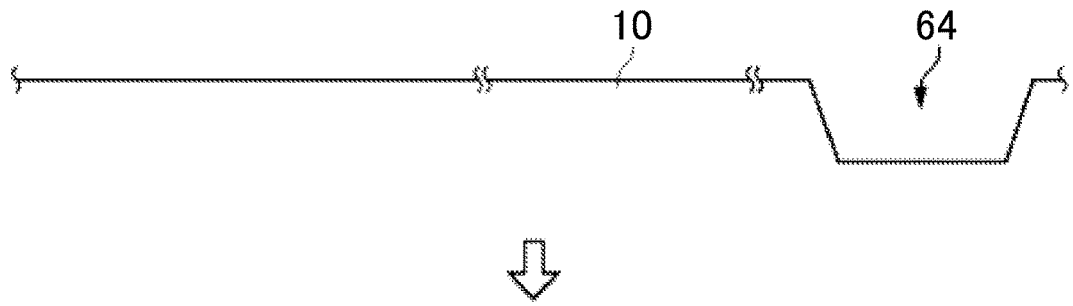
FIG. 6 is a drawing for partially describing another exemplary manufacturing process of the semiconductor device 100.
Figure 6:
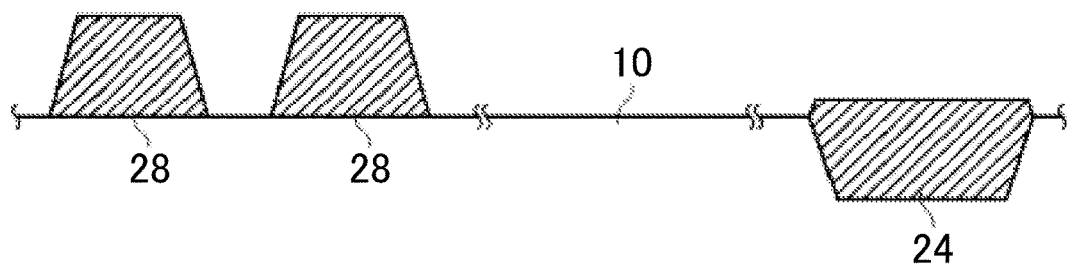
Figure 6:
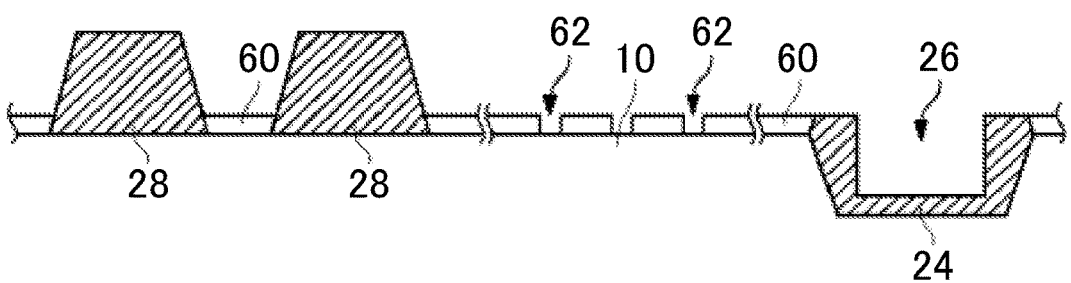

FIG. 6 is a drawing for partially describing another exemplary manufacturing process of the semiconductor device 100. In the present example, the element insulating film 24 is formed in a recessed portion 64, but the field insulating film 28 is formed on the front surface of the semiconductor substrate 10. In other words, the field insulating film 28 is not formed in a recessed portion 64.

First, in a recess formation step S216, the recessed portion 64 is formed corresponding to the element insulating film 24. It should be noted that no recessed portions 64 are formed corresponding to the field insulating film 28.

Next, in an insulating film formation step S218, the element insulating film 24 and the field insulating film 28 are formed. In the same manner as the insulation film formation step S200 shown in FIG. 4, in S218 as well, the element insulating film 24 and the field insulating film 28 may be formed simultaneously. In the present example, the element insulating film 24 can be formed lower than the field insulating film 28.

In the insulating film formation step S218, after the insulating film is formed on the entire front surface of the semiconductor substrate 10, for example, the insulating is removed while leaving behind the portion that will become the element insulating film 24 and the field insulating film 28. In each example shown in FIGS. 4 to 6, the element insulating film 24 and the field insulating film 28 may be LOCOS films, or may be formed by patterning the insulating film formed on the entire front surface of the semiconductor substrate 10.

Next, in a groove formation step S220, the groove 26 is formed in the element insulating film 24. In the same manner as in the groove formation step S202 shown in FIG. 4, the groove 26 may be formed at the same time as the openings 62 in the masking insulating film 60. The masking insulating film 60 may be formed using CVD or the like. The process after forming the openings 62 is the same as in the example shown in FIG. 4 or 5. With the semiconductor device 100 manufactured according to the manufacturing process of the present example, the element insulating film 24 is formed in the recessed portion 64, and therefore the unevenness in the front surface of the semiconductor substrate 10 can be reduced.

Figure 7:
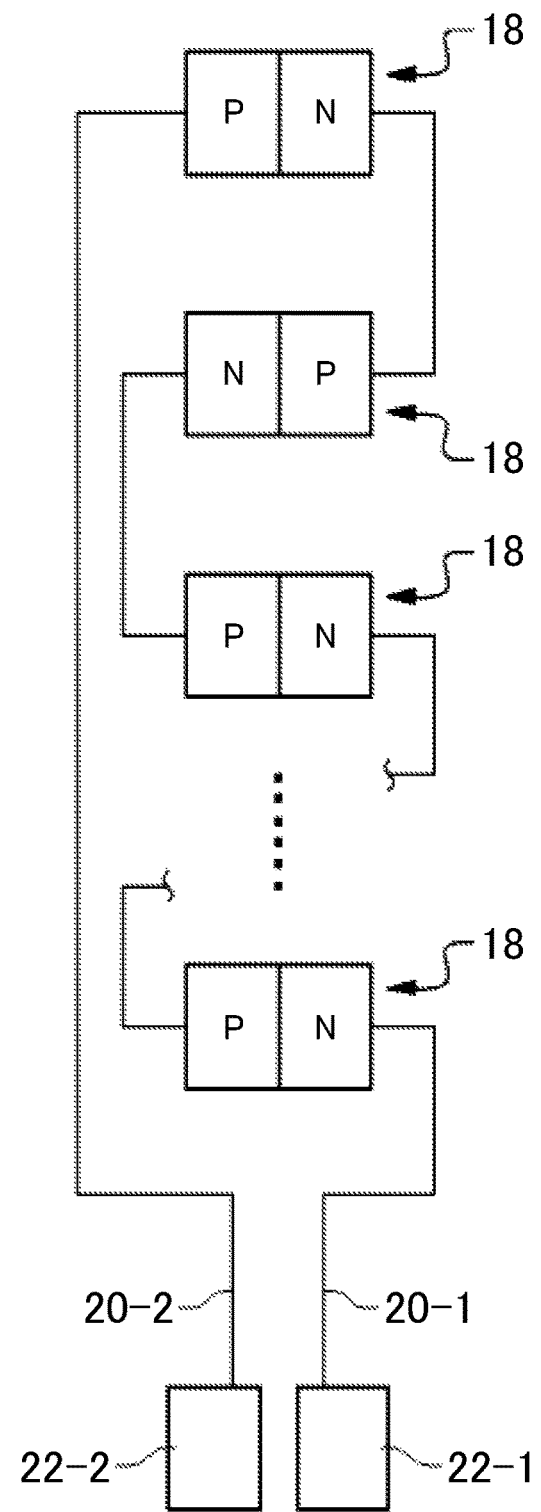
FIG. 7 is an overhead view of an exemplary arrangement of the diode 18 formed in the groove 26.

FIG. 7 is an overhead view of an exemplary arrangement of the diode 18 formed in the groove 26. In the present example, a plurality of diodes 18 connected in series are arranged in the groove 26. Wires that connects the diodes 18 to each other may also be formed inside the groove 26. The diodes 18 provided at the ends of this series are respectively connected to a first pad 22-1 and a second pad 22-2 via a first wire 20-1 and a second wire 20-2. The first wire 20-1 and the second wire 20-2 may also be arranged inside the groove 26.

Figure 8A:
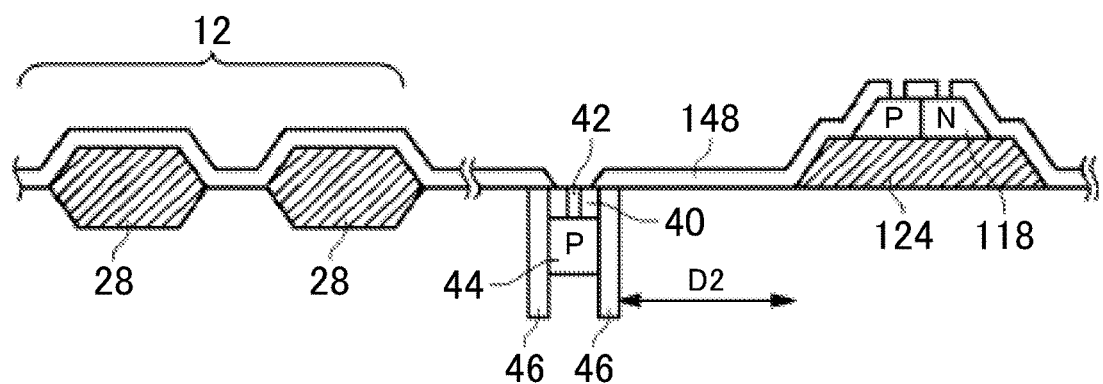
FIG. 8A shows a semiconductor device 300 as a comparative example.
Figure 8B:
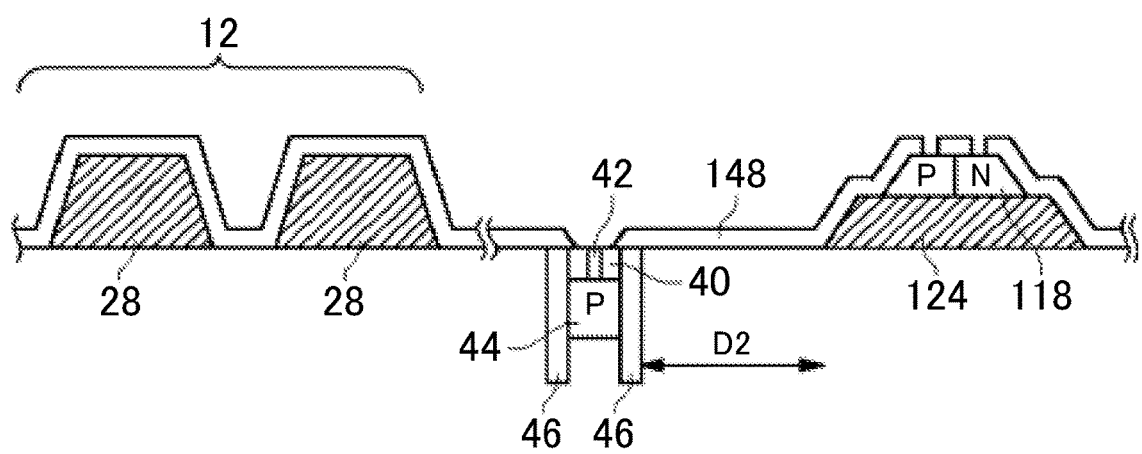
FIG. 8B shows a semiconductor device 300 as a comparative example.

FIGS. 8A and 8B show semiconductor devices 300 as comparative examples. In FIGS. 8A and 8B, a schematic view of the structure on the front surface side of the semiconductor device 300 is shown, and the metal electrodes and structure on the back surface side are omitted. In the semiconductor device 300, the diode 118 is arranged on an element insulating film 124 that does not include a groove. In the example of FIG. 8A, the field insulating film 28 formed using a LOCOS technique is arranged in the withstand voltage structure 12. In the example of FIG. 8B, the field insulating film 28 formed on the front surface of the semiconductor substrate is arranged in the withstand voltage structure 12.

Therefore, the height of the diode 118 increases relative to the front surface of the semiconductor substrate, and the flatness of the interlayer insulating film 148 and the like near the diode 118 is worsened. Accordingly, it becomes difficult to form a fine pattern near the diode 118, and the distance D2 between the power semiconductor element such as the IGBT and the diode 118 must be increased. As a result, the surface area where the power semiconductor element can be formed is decreased, or the chip size is increased. Furthermore, due to the worsening of the flatness, the dimensional variation and the like in the power semiconductor elements increases.

In particular, diodes for detecting temperature are often formed in the center of chips in order to improve the temperature detection accuracy. Therefore, when the height of the diode for detecting temperature increases, the effect on the surrounding region increases and the chip size increases.

In contrast to this, with the semiconductor device 100, it is possible to restrict the height of the diode 18 relative to the front surface of the semiconductor substrate 10, and therefore the distance D1 between the power semiconductor element such as the IGBT and the diode 118 can be decreased.

Furthermore, if the thickness of the element insulating film 124 is reduced, the height of the diode 118 can be decreased, but this requires adding a step of reducing the thickness of the element insulating film 124. With the manufacturing processes shown in FIGS. 4 to 6, it is possible to manufacture the semiconductor device 100 with fewer steps.

In the examples described above, the diode 18 is arranged in the groove 26 of the element insulating film 24, but the elements that can be arranged in the groove 26 are not limited to the diode 18. For example, a gate electrode formed of polysilicon or the like may be arranged in the groove 26, or other elements may be arranged in the groove 26.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 12: withstand voltage structure, 14: active region, 16: pad region, 18: diode, 20: wire, 22: pad, 24: element insulating film, 26: groove, 28: field insulating film, 30: guard ring, 32: drift region, 34: field stop layer, 36: collector layer, 38: collector electrode, 40: emitter region, 42: contact region, 44: base region, 46: gate trench, 48: interlayer insulating film, 50: diode electrode, 50a: diode electrode, 50b: diode electrode, 52: emitter electrode, 54: electrode, 56: gate insulating film, 58: gate electrode, 60: masking insulating film, 62: opening, 64: recessed portion, 100: semiconductor device, 118: diode, 124: element insulating film, 148: interlayer insulating film, 300: semiconductor device

What is claimed is:

1. A semiconductor device manufacturing method comprising:
   forming an element insulating film on a front surface side of a semiconductor substrate;
   forming a groove in the element insulating film such that the groove does not penetrate through the element insulating film; and
   forming a semiconductor element in the groove of the element insulating film.

2. The semiconductor device manufacturing method according to claim 1, further comprising:
   between the forming the element insulating film and the forming the groove, forming a masking insulating film on the front surface of the semiconductor substrate, wherein
   the forming the groove includes forming an opening in the masking insulating film at the same time as forming the groove.

3. The semiconductor device manufacturing method according to claim 1, wherein
   the forming the element insulating film includes forming a field insulating film farther to the outside of the semiconductor substrate than the semiconductor element at the same time as the element insulating film.

4. The semiconductor device manufacturing method according to claim 1, further comprising:
   before the forming the element insulating film, forming one or more recessed portions in the front surface of the semiconductor substrate, wherein
   the forming the element insulating film includes forming at least a portion of the element insulating film in the one or more recessed portions.

5. The semiconductor device manufacturing method according to claim 4, wherein
   the forming the one or more recessed portions includes forming the one or more recessed portions using isotropic etching.

6. A semiconductor device comprising:
   a semiconductor substrate;
   an element insulating film that is formed on a front surface side of the semiconductor substrate and includes a groove, the groove not penetrating through the element insulating film; and
   a semiconductor element provided in the groove of the element insulating film.

7. The semiconductor device according to claim 6, further comprising:
   a gate electrode and a gate insulating film formed on the front surface side of the semiconductor substrate, wherein
   film thickness of the element insulating film in a region where the groove is not provided is greater than film thickness of the gate insulating film.

8. The semiconductor device according to claim 7, wherein
   a gate trench is formed in the front surface side of the semiconductor substrate,
   the gate electrode and the gate insulating film are formed inside the gate trench, and
   width of the groove of the element insulating film is greater than width of the gate trench.

9. The semiconductor device according to claim 7, wherein
   width of the element insulating film in the region where the groove is not provided is greater than the film thickness of the gate insulating film.

10. The semiconductor device according to claim 7, wherein
    the film thickness of the element insulating film in a region where the groove is provided is greater than the film thickness of the gate insulating film.

11. The semiconductor device according to claim 10, wherein
    the film thickness of the element insulating film in the region where the groove is provided is greater than or equal to 300 nm.

12. The semiconductor device according to claim 6, wherein
    the semiconductor substrate includes an active region,
    the semiconductor device further comprises a withstand voltage structure farther to the outside than the active region,
    the semiconductor element is provided in the active region,
    the withstand voltage structure includes a field insulating film formed on the front surface of the semiconductor substrate, and
    film thickness of a region of the element insulating film where the groove is not provided is the same as film thickness of the field insulating film.

13. The semiconductor device according to claim 12, wherein
    the semiconductor substrate includes one or more recessed portions in the front surface, and
    at least a portion of the element insulating film is provided in a recessed portion among the one or more recessed portions.

14. The semiconductor device according to claim 13, wherein at least a portion of the field insulating film is provided in a recessed portion that is different from the one or more recessed portions in which the element insulating film is provided.

15. The semiconductor device according to claim 14, wherein
the entire field insulating film is provided in the recessed portion.

16. The semiconductor device according to claim 13, wherein
the entire element insulating film is provided in the recessed portion among the one or more recessed portions.

17. The semiconductor device according to claim 16, wherein
a front surface of the semiconductor element is provided at the same position as or at a lower position than the front surface of the semiconductor substrate.

* * * * *